(12) United States Patent
Sommer et al.

(10) Patent No.: US 11,380,814 B2
(45) Date of Patent: Jul. 5, 2022

(54) DICING METHOD FOR SEPARATING WAFERS COMPRISING A PLURALITY OF SOLAR CELL STACKS

(71) Applicant: AZUR SPACE Solar Power GmbH, Heilbronn (DE)

(72) Inventors: Steffen Sommer, Tamm (DE); Wolfgang Koestler, Heilbronn (DE); Alexander Frey, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 149 days.

(21) Appl. No.: 17/007,676

(22) Filed: Aug. 31, 2020

(65) Prior Publication Data
US 2021/0066533 A1  Mar. 4, 2021

(30) Foreign Application Priority Data
Aug. 29, 2019 (DE) .................... 10 2019 006 095.4

(51) Int. Cl.
*H01L 31/18* (2006.01)
*H01L 31/0475* (2014.01)
(Continued)

(52) U.S. Cl.
CPC .......... *H01L 31/186* (2013.01); *B23K 26/364* (2015.10); *H01L 21/78* (2013.01);
(Continued)

(58) Field of Classification Search
CPC ... H01L 31/186; H01L 21/78; H01L 31/0475; H01L 31/0481; H01L 31/18;
(Continued)

(56) References Cited

U.S. PATENT DOCUMENTS 5,922,224 A  7/1999  Broekroelofs
6,159,757 A  12/2000 Kamimura et al.
(Continued)

FOREIGN PATENT DOCUMENTS

CN  105895745 A  * 8/2016  .......... B23K 26/364
DE  102007059697 A1  6/2008
(Continued)

OTHER PUBLICATIONS

Dongshi Zhang et al: "Debris-free rear-side picosecond laser ablation of thin germanuim wafers in water with ethanol", Applied Surface Science, bd. 367, Jan. 12, 2016, pp. 222-230, XP055763709, Amsterdam, NL, ISSN: 0169-4332.

*Primary Examiner* — Earl N Taylor
(74) *Attorney, Agent, or Firm* — Muncy, Geissler, Olds & Lowe, P.C.

(57) ABSTRACT

A dicing method for separating a wafer comprising a plurality of solar cells stack along at least one parting line, at least having the steps of: providing the wafer with a top, a bottom, an adhesive layer which is integrally bonded with the top and a cover glass layer which is integrally bonded with the adhesive layer, wherein the wafer includes a plurality of solar cell stacks, each having a germanium substrate layer forming the bottom of the wafer, a germanium sub-cell and at least two III-V sub-cells; creating a separating trench along the parting line by means of laser ablation, which extends from a bottom of the wafer through the wafer and the adhesive layer at least up to a top of the cover glass layer; and dividing the cover glass layer along the separating trench.

12 Claims, 2 Drawing Sheets

(51) Int. Cl.
*H01L 21/78* (2006.01)
*B23K 26/364* (2014.01)
*H01L 31/0687* (2012.01)
*B23K 101/40* (2006.01)
*B23K 103/00* (2006.01)

(52) U.S. Cl.
CPC ...... *H01L 31/0475* (2014.12); *H01L 31/0687* (2013.01); *B23K 2101/40* (2018.08); *B23K 2103/56* (2018.08)

(58) Field of Classification Search
CPC ............. H01L 31/0687; H01L 31/0725; H01L 31/0224; Y02E 10/544; B23K 26/00; B23K 26/362; B23K 26/364; B23K 26/38; B23K 2101/40; B23K 2103/56
See application file for complete search history.

(56) References Cited

U.S. PATENT DOCUMENTS

| | | | |
|---|---|---|---|
| 6,300,558 B1 | 10/2001 | Takamoto et al. | |
| 6,331,208 B1 | 12/2001 | Nishida et al. | |
| 10,770,606 B2 | 9/2020 | Anthony et al. | |
| 10,916,461 B2 | 2/2021 | Vanagas et al. | |
| 11,233,165 B2* | 1/2022 | Jeong | H01L 31/1864 |
| 2011/0120521 A1* | 5/2011 | Yamaguchi | B23K 26/364 136/244 |
| 2011/0171757 A1* | 7/2011 | Yamamuro | B23K 26/364 257/E31.11 |
| 2011/0247672 A1 | 10/2011 | Van Riesen et al. | |
| 2012/0055540 A1 | 3/2012 | Yamaguchi | |
| 2017/0323840 A1 | 11/2017 | Chiu et al. | |
| 2017/0345955 A1 | 11/2017 | Chary et al. | |
| 2020/0274015 A1* | 8/2020 | Jeong | H01L 31/074 |

FOREIGN PATENT DOCUMENTS

| | | | | |
|---|---|---|---|---|
| DE | 102010005970 A1 | * | 8/2011 | ......... B23K 26/0608 |
| EP | 0 926 743 A2 | | 6/1999 | |
| EP | 2426734 A2 | | 3/2012 | |
| FR | 3084203 A1 | * | 1/2020 | ......... B23K 26/0608 |
| JP | 2011198965 A | * | 10/2011 | ........... B23K 26/364 |
| RU | 2244986 C1 | | 1/2005 | |
| RU | 2672760 C1 | | 11/2018 | |
| RU | 2677574 C1 | | 1/2019 | |
| WO | WO9729509 A1 | | 8/1997 | |
| WO | WO-2012147200 A1 | * | 11/2012 | ......... B23K 26/0643 |
| WO | WO 2017/019308 A1 | | 2/2017 | |

* cited by examiner

//  DICING METHOD FOR SEPARATING WAFERS COMPRISING A PLURALITY OF SOLAR CELL STACKS

This nonprovisional application claims priority under 35 U.S.C. § 119(a) to German Patent Application No. 10 2019 006 095.4, which was filed in Germany on Aug. 29, 2019, and which is herein incorporated by reference.

BACKGROUND OF THE INVENTION

Field of the Invention

The present invention relates to a dicing method for separating wafers comprising a plurality of solar cell stacks.

Description of the Background Art

Wafers are typically separated using an abrasive cutting process, i.e., they are mechanically separated. Separation by means of laser ablation along parting lines is also known.

Alternatively, in a so-called scribing process, small trenches are created, mechanically or by laser ablation, as predetermined breaking points along parting lines in the top or bottom and the wafer is subsequently divided by breaking along the predetermined breaking points.

It is also possible to modify the material in a particular depth in the wafer with a so-called stealth dicing process, which also creates predetermined breaking points along which dicing can take place by breaking.

The dicing methods are each adapted to the material to be divided, such as a semiconductor material.

SUMMARY OF THE INVENTION

It is therefore an object of the present invention to provide a device which further develops the prior art.

According to an exemplary embodiment of the invention, a dicing method is provided for separating a wafer comprising a plurality of solar cell stacks along at least one parting line, comprising at least the steps of: providing the wafer comprising a top, a bottom, an adhesive layer which is integrally bonded with the top and a cover glass layer which is integrally bonded with the adhesive layer, wherein the wafer includes a plurality of solar cell stacks, each comprising a germanium substrate layer forming the bottom of the wafer, a germanium sub-cell and at least two III-V sub-cells; creating a separating trench along the parting line by means of laser ablation, which extends from a bottom of the wafer through the wafer and through the adhesive layer at least up to a bottom of the cover glass layer adjoining the adhesive layer; and dividing the cover glass layer along the separating trench.

The individual sub-cells of the solar cell stacks each can have a p/n junction and that the layers following the substrate are epitaxially generated on one another and/or connected to one another by means of wafer bonding.

In addition, a Ge sub-cell can contain germanium or consists of germanium, wherein a layer consisting of germanium may optionally also contain other substances, for example, dopants, but also impurities in addition to the germanium.

The same also applies for the III-V sub-cells, which comprise one or more materials of main groups III and V or consist of such materials.

Mechanical separation of the composite of wafer, adhesive and cover glass layer is not possible due to the hardness of the glass and the expected deposits of the adhesive on a cutting blade.

Due to the fact that the separating trench is created from the bottom of the wafer only up to the bottom of the cover glass layer or up to an area of the cover glass layer directly adjacent to the bottom, it is possible to create the separating trench despite the very different optical and thermal properties, in particular without unnecessary damage to the adhesive layer.

The separating trench on the bottom of the wafer has to be sufficiently wide in order to be able to focus the laser beam for the laser ablation up to the cover glass layer up to a sufficient depth. On the other hand, the separating trench in the wafer acts as an aperture and reduces back-scattering from the cover glass layer into active layers of the wafer.

The dicing method makes it possible to separate the composite of wafer, adhesive and cover glass. The cover glass is thus already applied at the wafer level and must only be adjusted once and only relatively roughly.

In addition, the dicing method ensures that the cover glass ends at least flush with the side faces of the wafer or even has an overhang. This reliably protects the top of the wafer against environmental influences.

The separating trench is created up to an area of the cover glass layer adjoining the adhesive layer. The laser ablation in a lower area of the cover glass layer essentially represents an etching process, also called scribing. By scribing the cover glass layer, for example, breakage of the cover glass layer along the separating trenches is simplified.

The cover glass layer can be divided by breaking or cutting.

For the laser ablation, a laser is moved on the bottom of the wafer along at least one track which extends along or parallel to the parting line, and energy input occurs along the track by means of a focused laser beam.

In a further development, the energy input takes place along at least 2 and at most 30 tracks.

The energy input can take place in one ablation pass along n tracks with 1≤n≤30 and the ablation pass is repeated at least once, wherein the number n of tracks remains the same or is reduced with each repetition and wherein the number n is reduced with at least one repetition.

The ablation pass can be repeated at least once and a maximum of 40 times.

The energy input takes place in an ablation pass with a first power density and with a first focal plane and is repeated at least once, wherein with at least one repetition, the power density and/or the focus plane is changed.

According to a further development, the top of the cover glass layer may be integrally bonded to a foil prior to creating the trench.

In another development, the adhesive layer comprises silicone and can have a thickness of at least 5 μm.

The cover glass layer can have a layer thickness of at least 50 μm.

The energy input can be carried out by means of a pulsed laser, wherein the duration of the pulse is between 10 fs and 100 ns and/or a wavelength is between 315 nm and 1070 nm or between 1.5 μm and 10.6 μm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
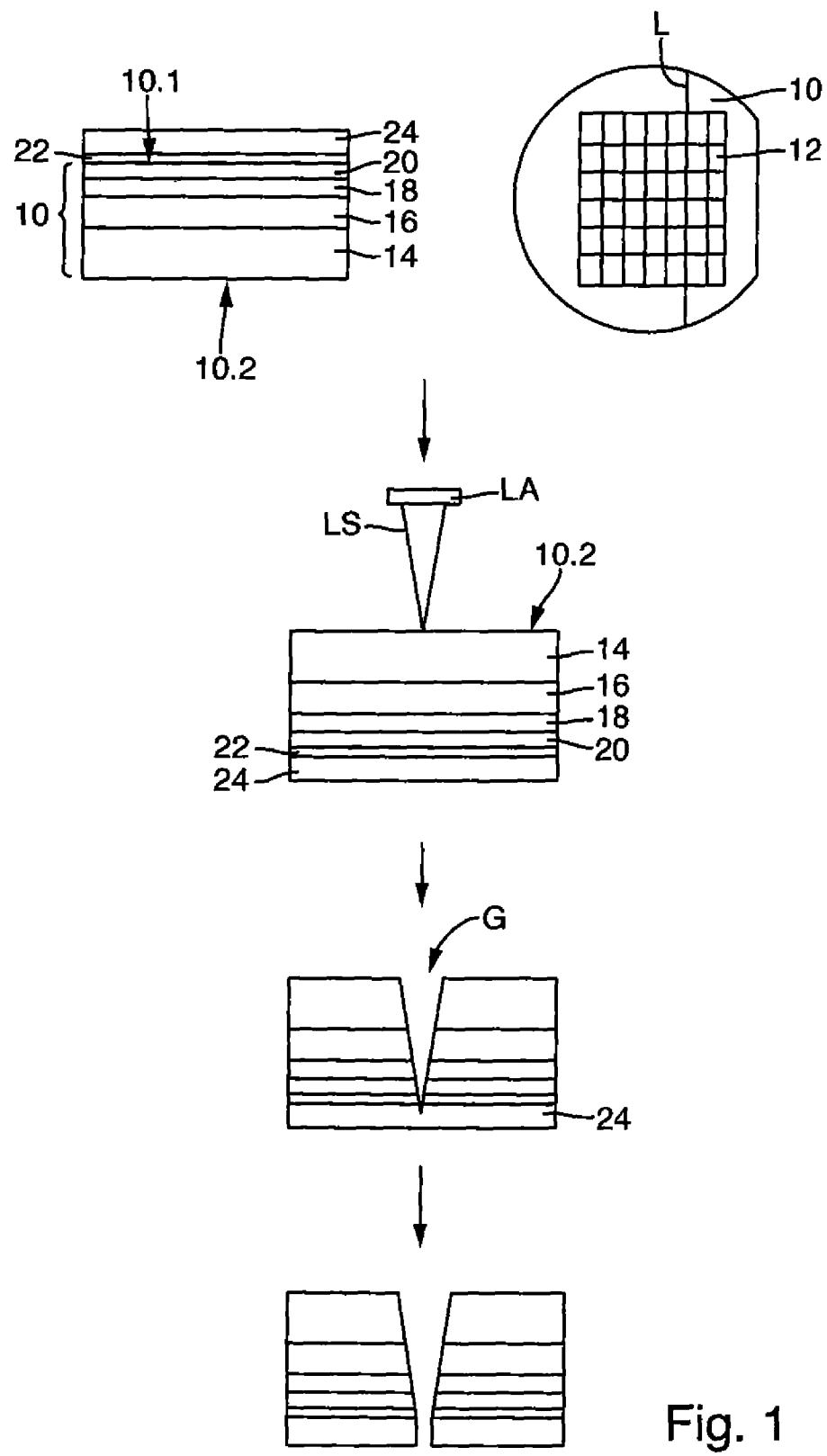
FIG. 1 is a schematic sequence according to an exemplary embodiment of a dicing method of a wafer according to the invention.

The illustration in FIG. 1 schematically shows a sequence of a dicing method for separating a wafer comprising a plurality of solar cells stacks according to a first inventive embodiment.

A wafer 10 comprising a plurality of solar cell stacks 12 having a top 10.1 and a bottom 10.2 is provided. The wafer 10 comprises a layer sequence of a germanium substrate 14 forming the bottom 10.2, a germanium sub-cell 16, a first III-V sub-cell 18 and a second III-V sub-cell 20 forming the top 10.1. An adhesive layer 22 is arranged on the top 10.1 and a cover glass layer 24 is arranged on the adhesive layer 22.

The solar cell stacks 12 of the wafer 10 are diced along parting lines L. To this end, a trench G, which extends from the bottom 10.2 through the substrate layer 14 and the sub-cells 16, 18, 20 of the wafer 10 and through the adhesive layer 22 up into the cover glass layer 24, is created by means of laser ablation with a laser moving along the parting lines L and a laser beam LS impinging on the bottom 10.2 of the wafer. The trench G ends in an area of the cover glass layer 24 adjoining the adhesive layer 22, wherein the area occupies a maximum of one third of the total thickness of the cover glass layer 24.

Subsequently, the cover glass layer 24 is divided along the parting lines L by breaking or by sawing, whereby the solar cell stacks are separated from each other.

Figure 2:
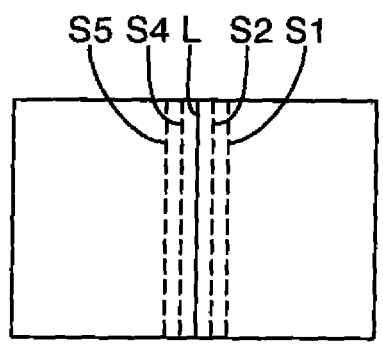
FIG. 2 is a view of an exemplary embodiment of the dicing method.

A further embodiment is shown in the illustration in FIG. 2. In the following, only the differences from the illustration in FIG. 1 are highlighted.

To create the trench G along a parting line L, the laser ablation is carried out along the parting line L and along another four tracks S1, S2, S4, S5 extending parallel to the parting line L.

Figure 3:
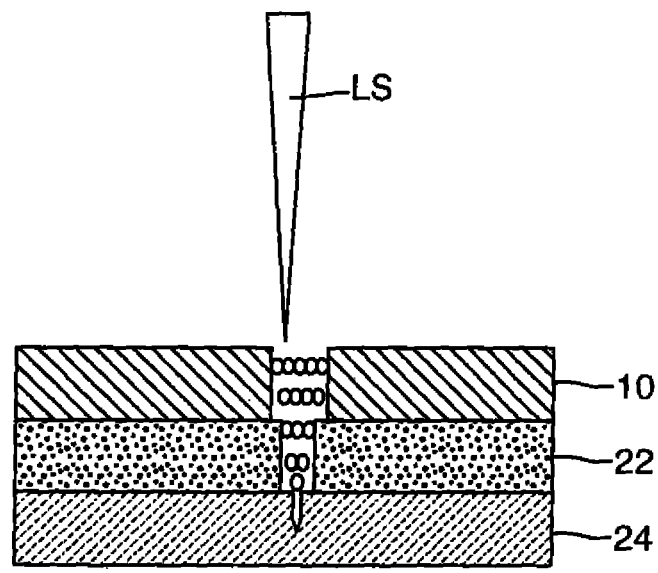
FIG. 3 is a view of an exemplary embodiment of the dicing method.
Figure 4:
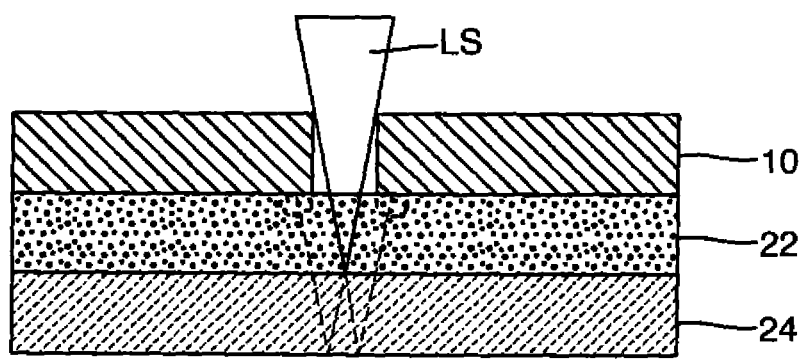
FIG. 4 is another view of the dicing method.

Another embodiment is shown in the illustration in FIG. 3. In the following, only the differences from the illustration in FIG. 2 are explained.

The laser ablation takes place in five passes, wherein in a first pass, the laser ablation is carried out along the parting line and a further four tracks. In each subsequent pass, the laser ablation is carried out with a lower focal plane and along a number of tracks reduced by one.

In the illustration in FIG. 3, a light path is shown through the wafer 10, the adhesive layer 22 and the cover glass layer 24.

Light diffracted from the exit surface of the cover glass layer 24 can, as in the illustrated case, strike the top 10.1 of the wafer 10 and damage the top 10.1 of the wafer 10.

With a suitable choice of the energy density or the intensity and the course of the focus, damage is suppressed or at least reduced.

In particular, the intensity is strongly weakened if, for example, the laser beam LS has a large opening angle, that is, if the laser beam expands quickly beyond the focal plane.

It should be noted that when processing with a greater Rayleigh length in conjunction with a suitable width of the trench G, the impingement of reflected light on the top 10.1 of the wafer 10 can be reliably suppressed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A dicing method for separating a wafer along at least one parting line, the method comprising:
    providing the wafer having a top, a bottom, an adhesive layer that is integrally bonded to the top and a cover glass layer that is integrally bonded to the adhesive layer, the wafer having at least two solar cell stacks, each of the at least two solar cell stacks comprising a germanium substrate layer forming the bottom of the wafer, a germanium sub-cell and at least two III-V sub-cells;
    creating a separating trench that extends from the bottom of the wafer through the wafer and through the adhesive layer at least up to a bottom of the cover glass layer adjoining the adhesive layer along the parting line via laser ablation; and
    dividing the cover glass layer along the separating trench.

2. The method according to claim 1, wherein the separating trench is created up to an area of the cover glass layer adjoining the adhesive layer.

3. The method according to claim 1, wherein the dividing of the cover glass layer is carried out by breaking or by sawing.

4. The method according to claim 1,
    wherein, for the laser ablation, a laser is moved on the bottom of the wafer along at least one track, which extends along or parallel to the parting line, and
    wherein an energy input takes place along the at least track via a focused laser beam from the laser during the laser ablation.

5. The method according to claim 4, wherein the energy input takes place along the at least one track comprising at least two and at most thirty tracks.

6. The method according to claim 1,
    wherein, in a laser ablation pass for creating the separating trench, an energy input from a laser takes place along a number n tracks with $1 \leq n \leq 30$ and the laser ablation pass being repeated at least once,
    wherein the number n of the tracks remains the same or is reduced with each repetition, and
    wherein the number n is reduced with at least one repetition.

7. The method according to claim 6, wherein the laser ablation pass is repeated at least once and at most 40 times.

8. The method according to claim 1,
    wherein, in a laser ablation pass for creating the separating trench, an energy input from a laser is carried out with a power density and with a focal plane and the laser ablation pass is repeated at least once, and wherein the power density and/or the focal plane is changed in at least one repetition.

9. The method according to claim 1, wherein, prior to creating the separating trench, a top of the cover glass layer is integrally bonded with a foil.

10. The method according to claim 1, wherein the adhesive layer comprises silicone and has a layer thickness of at least 5 µm.

11. The method according to claim 1, wherein the cover glass layer has a layer thickness of at least 50 µm.

12. The method according to claim 1, wherein in a laser ablation pass for creating the separating trench, an energy input is carried out via a laser beam of a pulsed laser along at least one track extending along or parallel to the parting line, and wherein a duration of a pulse of the laser beam is between 10 fs and 100 ns and/or a wavelength of the laser beam is between 315 nm and 1070 nm or between 1.5 µm and 10.6 µm.

* * * * *